United States Patent [19]
Rose et al.

[11] Patent Number: 5,379,242
[45] Date of Patent: Jan. 3, 1995

[54] ROM FILTER

[75] Inventors: Dennis M. Rose; Daniel E. Fague, both of Sunnyvale, Calif.

[73] Assignee: National Semiconductor Corporation, Santa Clara, Calif.

[21] Appl. No.: 115,491

[22] Filed: Sep. 1, 1993

[51] Int. Cl.[6] .............................................. G06F 15/31
[52] U.S. Cl. .............................. 364/724.01; 364/724.16
[58] Field of Search ....................... 364/724.01, 724.16

[56] References Cited

U.S. PATENT DOCUMENTS

| | | | |
|---|---|---|---|
| 4,794,555 | 12/1988 | Kojima et al. | 364/724.01 |
| 4,835,723 | 5/1989 | Hansen | 364/724.01 |
| 4,958,311 | 9/1990 | Kadowaki et al. | 364/724.01 |
| 5,097,433 | 3/1992 | Caracciolo | 364/724.01 |

OTHER PUBLICATIONS

K. Feher, "Digital Communications", *Satellite/Earth Station Engineering*, Prentice-Hall, Inc., 1983, pp. 91-201.

National Semiconductor Preliminary Data Sheet, "LMX2410 Baseband Processor for Radio Communications", Mar. 1993, pp. 1-16.

Y. Akaiwa, "Digital Modulation/Demodulation Techniques for Mobile Radio Communications in Japan", IEICE Transactions, vol. E74, No. 6, Jun. 1991, pp. 1503-1511.

National Semiconductor Preliminary Data Sheet, "LMX2411 Baseband Processor for Radio Communications", Sep. 1993, pp. 1-10.

*Primary Examiner*—David H. Malzahn
*Attorney, Agent, or Firm*—H. Donald Nelson; David E. Steuber; Richard J. Roddy

[57] ABSTRACT

A ROM filter includes a number of ROMs, each of which is programmed to hold data relating to several pulse response curves during only a particular time interval. As data are read into the filter, data pertaining to a particular pulse response curve are addressed in each of the ROMs. The outputs of the ROMs are connected to an adder, which adds the data read from the ROMs and passes it through a digital-to-analog converter. In this arrangement, the ROMs are required to store only the data relating to the pulse response curves during a particular interval. These data are added together in real time in an adder which is external to the ROM. With this structure the area of the ROM can be significantly reduced, as compared with ROM filters in which the addition is programmed into the ROM.

19 Claims, 10 Drawing Sheets

ROM FILTER

BACKGROUND OF THE INVENTION

1. Field of the Invention

This invention relates generally to digital filtering and particularly to a ROM filter which requires less memory capacity than conventional ROM filters.

2. Description of the Prior Art

Figure 1:
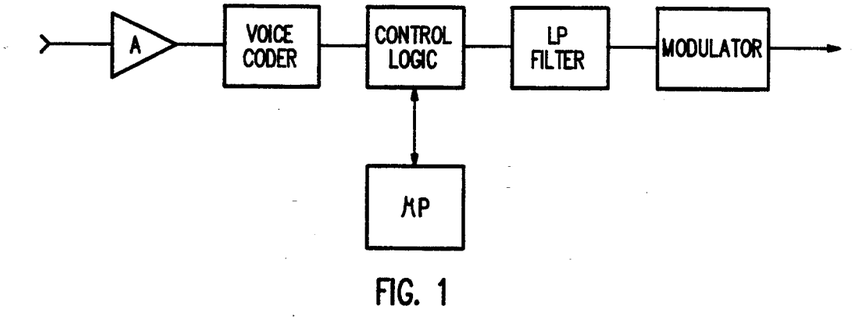
FIG. 1 illustrates a simplified block diagram of the transmit section of a cordless telephone.
Figure 2:
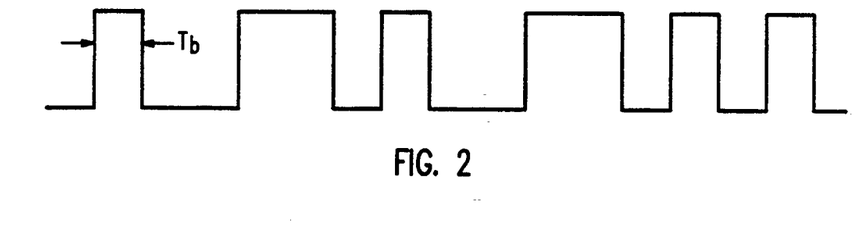
FIG. 2 illustrates a stream of binary data bits.

In many applications it is necessary to filter an electrical signal to remove unwanted frequencies. For example, in digital communications, before the outgoing digital data modulates the carrier, a low-pass filter is used to shape the data to conform to the spectral shaping requirements of the system. For example, FIG. 1 illustrates a block diagram of the transmit section of a cordless telephone. The voice signal is amplified and sent to a voice coder, where it is converted into digital form. It is then passed through control logic, which operates in conjunction with a microprocessor to handle all timing critical tasks as well as data buffering, data coding/decoding, data compression, and other digital processing steps. The microprocessor controls the user interface, i.e., keyboard control, display driver, call set-up protocol. The output of the control logic is typically a string of binary data pulses such as are illustrated in FIG. 2. These pulses have a bit duration of $T_b$ and a frequency $f_b = 1/T_b$, as illustrated in FIG. 2. The pulses illustrated in FIG. 2 are so-called non-return-to-zero (NRZ) bits in which a binary 1 is represented by a positive voltage and a binary 0 is represented by an equal negative voltage. As is known, data bits can either be in the form of NRZ pulses or return-to-zero (RZ) pulses, the difference being in the cycle of the positive voltage. In an NRZ system the duty cycle of the positive voltage is 100%, while in an RZ system the duty cycle of the positive voltage is 50%. In both systems, the duty cycle of the negative voltage is typically 100%.

Figure 3:
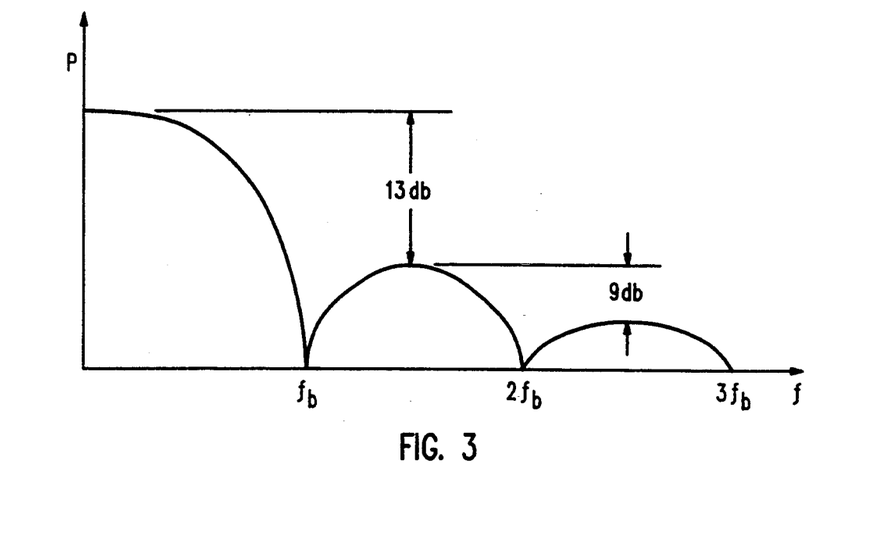
FIG. 3 illustrates, in the frequency domain, the output of the data stream shown in FIG. 2.

The pulses illustrated in FIG. 2 can be illustrated in the frequency domain in the manner shown in FIG. 3, wherein the ordinate is the power transmitted at a given frequency. Most of the power lies in the region from 0 Hz (DC) to $f_b$, the remaining power being in a series of lobes that are attributable to harmonics of the frequencies in the region below $f_b$. The curve touches the horizontal axis at $f_b$, $2f_b$, $3f_b$, etc. Typically, for NRZ data the lobe between $f_b$ and $2f_b$ has a maximum which is 13 db below the maximum of the main lobe, and the lobe between $2f_b$ and $3f_b$ has a maximum 9 db below the maximum of the second lobe.

It is desirable to filter out a large portion of the higher frequencies since, if they are not filtered, they can interfere with voice or data communication on adjacent channels. According to Nyquist's minimum-bandwidth theorem, the responses to rectangular data pulses can be observed independently (i.e., without intersymbol interference) if they are passed through a low-pass filter having a cutoff frequency $f_N = f_b/2$, along with an (x/sinx)-shaped amplitude equalizer.

One conventional technique of accomplishing this is to use an L-C filter to filter out the unwanted frequencies. Another known method is to use a read-only memory (ROM) filter, which is programmed to store information which in essence simulates the response of a conventional L-C filter. L-C filters operate in the analog domain, whereas ROM filters operate in the digital domain.

Figure 4A:
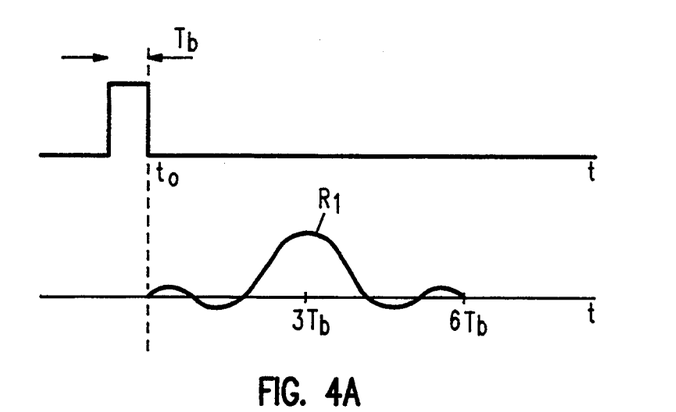
FIGS. 4A and 4B illustrate the pulse response of a rectangular positive-going data pulse (binary "1") and a rectangular negative-going data pulse (binary "0"), respectively.
Figure 4B:
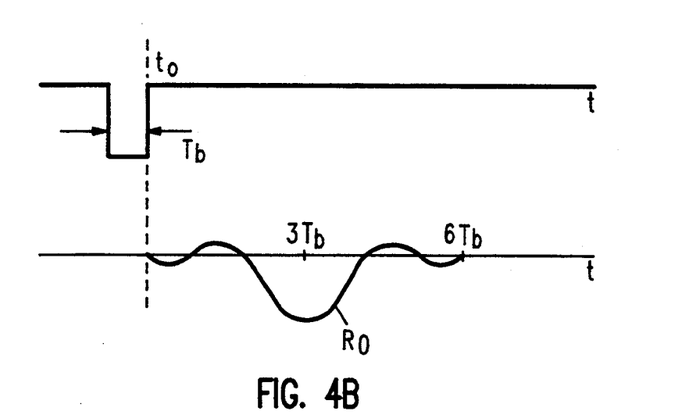
Figure 4C:
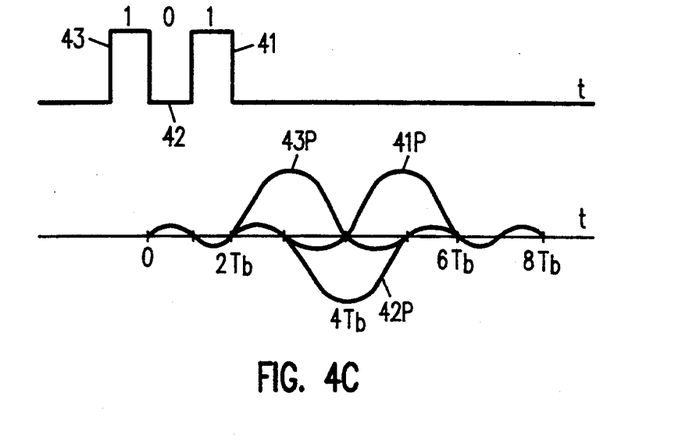
FIG. 4C illustrates the pulse response of a series of data bits that are interfering with one another.

FIGS. 4A–4C illustrate the manner in which a ROM filter is programmed. Curve $R_1$ in FIG. 4A approximates the response of an L-C filter to the positive-going data pulse illustrated above. Similarly, in FIG. 4B, curve $R_o$ approximates the response of an L-C filter to a negative-going data pulse. Curves $R_0$ and $R_1$ are referred to as "pulse response curves" and in FIGS. 4A and 4B they extend over a time equal to $6T_b$. In a ROM filter, data is stored which corresponds to the values of curves $R_0$ and $R_1$ at given intervals.

FIG. 4C illustrates how a series of bits 101 would interfere with each other after being passed through an L-C filter. As is apparent, the output of the filter, at any given time, is the summation of three pulse response curves, 41P, 42P and 43P displaced by a time $T_b$. The pulse response curve 41P (which duplicates curve $R_1$) results from the "1" bit designated 41; the pulse response curve 42P (which duplicates curve $R_0$) results from the "0" bit designated 42; and the pulse response curve 43P (which duplicates curve $R_1$) results from the "1" bit designated 43. As will be apparent from an examination of FIG. 4C, the summation of the three pulse response curves in each separate $T_b$ interval is in reality a summation of segments of curves $R_0$ and $R_1$ illustrated in FIGS. 4A and 4B. For example, in the interval 0–1Tb, curve 43P is the only curve present, and the summation is therefore simply the segment of pulse response curve $R_1$ in the interval 0–$1T_b$. In the interval $1T_b$–$2T_b$, curve $R_1$ in the interval $T_b$–$2T_b$ is added to curve $R_0$ in the interval 0–$T_b$. In the interval $2T_b$–$3T_b$, the segments of curve $R_1$ in the intervals 0–$T_b$ and $2T_b$–$3T_b$ are added to the segment of curve $R_0$ in the interval $T_b$–$2T_b$. Similarly, for each $T_b$ interval, the summation of curves 41P–43P is equal to a summation of pulse response curves $R_0$ and $R_1$ in specified time intervals. To simplify the drawing, FIG. 4C illustrates the pulse response curves for only three bits. In reality, the pulse response curves for six data bits would be summed (assuming the length of the pulse response curve = $6T_b$). Thus, the summation of the curves in any $T_b$ interval represents the addition of six segments of curves $R_0$ and $R_1$, and, depending on the particular sequence of data bits, there are 64 possible summation curves during any $T_b$ interval.

Figure 5:
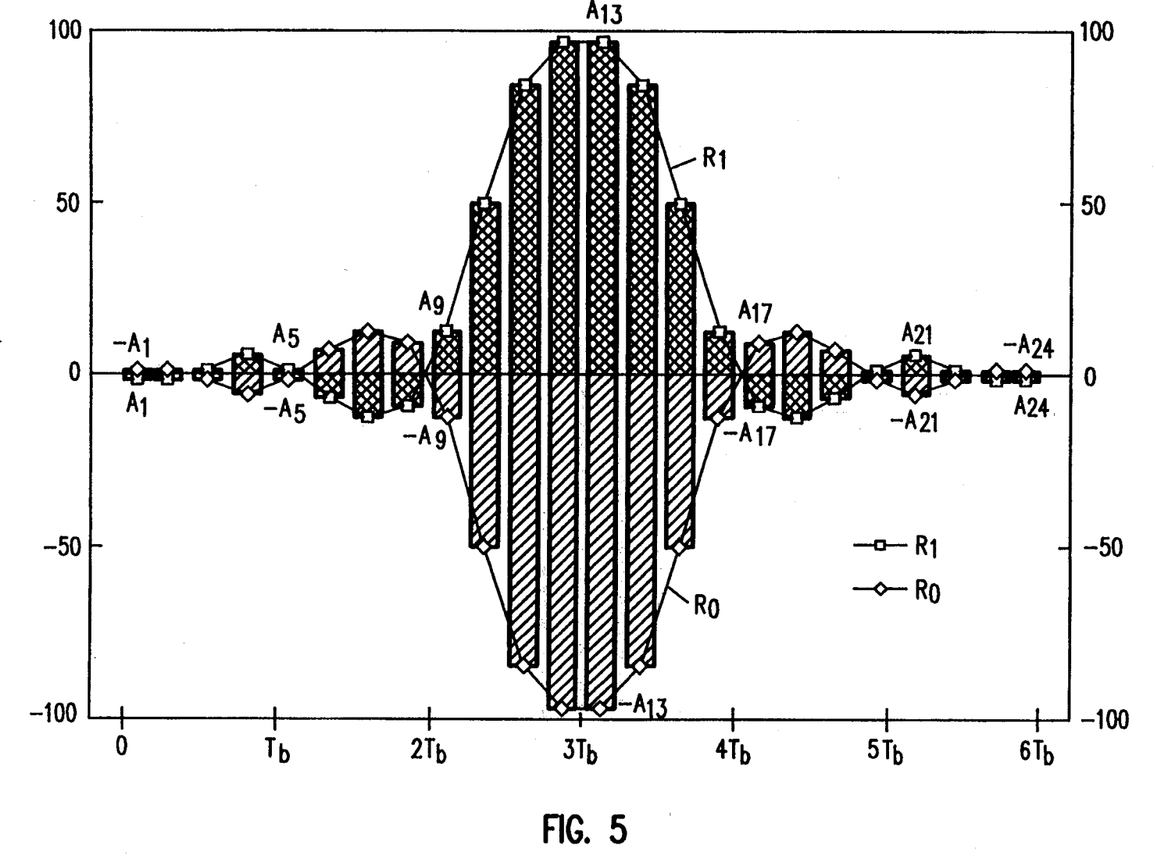
FIG. 5 illustrates digital values defining pulse response curves for a binary "1" and a binary "0", respectively.

FIG. 5 illustrates how the pulse response curves of FIGS. 4A and 4B can be digitized by selecting a specified number of points within each interval $T_b$. In FIG. 5, each $T_b$ interval is broken into four data points, so that each of the pulse response curves $R_0$ and $R_1$ is defined by a total of 24 data points. Since curves $R_0$ and $R_1$ are mirror images of each other, each data point can be represented by a value $A_n$ or its opposite $-A_n$. With four data points during each $T_b$ interval, the values of curve $R_1$ may be represented as $A_1$ to $A_{24}$ and the values of curve $R_0$ may be represented as $-A_1$ to $-A_{24}$.

Figure 6:
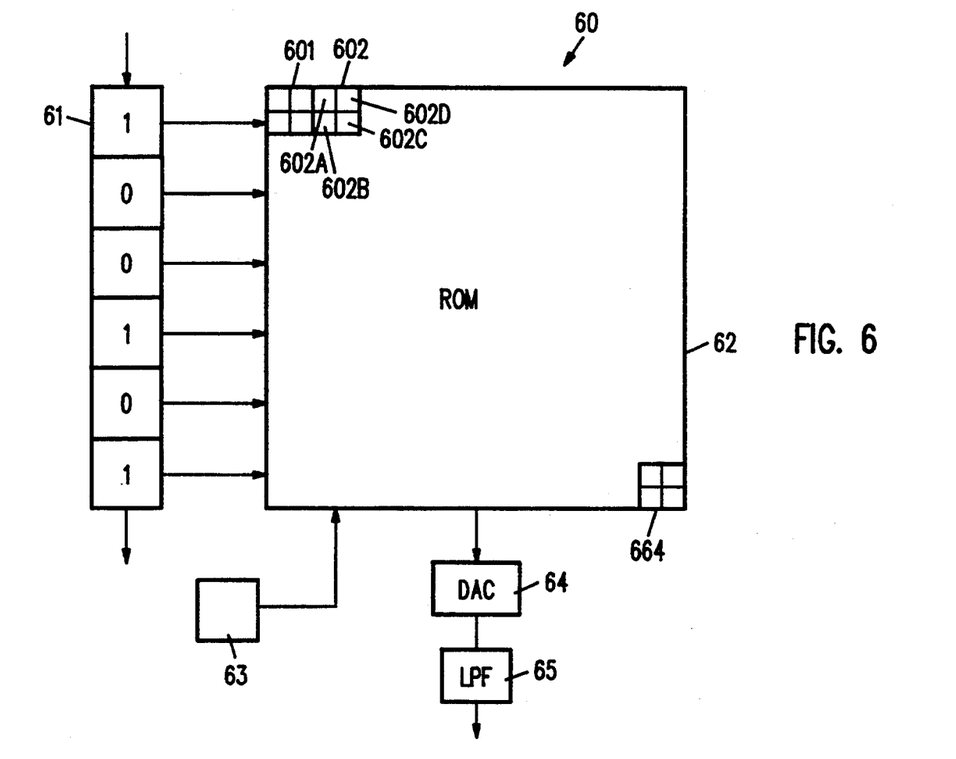
FIG. 6 illustrates a block diagram of a conventional ROM filter.

FIG. 6 illustrates a simplified block diagram of a conventional ROM filter. ROM filter 60 includes a 6-bit register 61, into which the transmit data are shifted. The outputs of the six stages of register 61 are read into a read-only memory (ROM) 62. ROM 62 includes a plurality of groups of memory locations, which are designated by the numerals 601, 602, ..., 664. Each of memory groups 601–664 includes four locations, for example, 602A, 602B, 602C and 602D. ROM 62 is pulsed by an oversample clock generator 63, and the output of ROM 62 is passed through a digital-to-analog converter (DAC) 64. A low-pass filter 65 is connected at the output of DAC 64.

The data stream is shifted into register 61 at a rate of $f_b = 1/T_b$. The clock rate for of oversample clock generator 63 is equal to $4f_b$. The contents of register 61 together form a 6-bit address identifying one of memory groups 601–664, the individual locations of which (e.g., 602A–602D) are programmed with values which represent the summation of data points on the curves shown in FIG. 5.

An example will assist in explaining how memory groups 601–664 are programmed. Assume that the 6-bit address 100101 has just been shifted into register 61. This means that the latest bit shifted into register 61 was a "1". During the following $T_b$ interval, the portion of the pulse response curve attributable to this binary "1" may be represented by the values $A_1$, $A_2$, $A_3$ and $A_4$ in FIG. 5 Since the preceding bit was a "0" the digital values representing the portion of the pulse response curve attributable to this bit are represented by the values, $-A_5$, $-A_6$, $-A_7$ and $-A_8$. The values represented by the next preceding binary "0" are represented by $-A_9$, $-A_{10}$, $-A_{11}$ and $-A_{12}$. For the next preceding binary "1" the values would be $A_{13}$, $A_{14}$, $A_{15}$ and $A_{16}$. The same process would be followed for the remaining two bits.

As noted above, oversample clock generator 63 pulses at a rate equal to $4f_b$. The four locations in each of memory groups 601–664 are programmed with four values which define the curve obtained by summing data points on curves $R_0$ and $R_1$. Assume for example, the 6-bit address 100101 shown in FIG. 6 identifies memory group 602. Memory location 602A therefore contains the values:

$$A_1 - A_5 - A_9 + A_{13} - A_{17} + A_{21}$$

Locations 602B, 602C and 602D contain the following values:

602B: $A_2 - A_6 - A_{10} + A_{14} - A_{18} + A_{22}$

602C: $A_3 - A_7 - A_{11} + A_{15} - A_{19} + A_{23}$

602D: $A_4 - A_8 - A_{12} + A_{16} - A_{20} + A_{24}$

Similarly, each of the remaining memory groups 601–664 is programmed to contain a sequence of four values corresponding to a particular combination of bits in register 61.

After oversample clock generator 63 pulses through the four summations represented by the values programmed in each memory location, the next bit is shifted into register 61, and the process is repeated. The sequence of digital values read out of ROM 62 is converted into analog form in DAC 64. The analog output of DAC 64 is smoothed in low pass filter 65.

The number of bits required in ROM 62 can be expressed by the following formula:

$$S^n \times \Delta \times D$$

where S is the number of symbol states of the data (e.g., two for binary data), n is the number of pulse responses that are interfering with one another (i.e., the number of stages in register 61), $\Delta$ is the number of oversample clock pulses for each data bit ($f_{ov}/f_b$), and D is the number of bits in the word delivered to DAC 64. For example, if DAC 64 receives 8-bit words, the number of bits required for ROM 62 is:

$$2^6 \times 4 \times 8 = 2{,}048 \text{ bits}$$

With present technology, such a ROM would have an area on the order of 600 square mils. This is a manageable size. However, ROM size can become a significant problem when data systems having more than two symbol states are used. For example, if a system with five symbol states is used, the above expression becomes $5^6 \times 4 \times 8$, or 500,000 bits. The area required for such a ROM is over 17,000 square mils.

Thus there is a real need for a filter having a reduced ROM size, particularly when data having three or more symbol states are being filtered.

SUMMARY OF THE INVENTION

In a ROM filter according to this invention, a ROM is divided into a plurality of sections. The number of sections in the ROM corresponds to the number of data bits represented by the pulse response curve. A plurality of separate ROMs may be used in place of the multi-sectional ROM.

Each such section of the ROM (or separate ROM) contains several subsections. The data in each subsection corresponds to a set of values within a selected section of the pulse response curve. Particular values of the curve are selected in sequence by an oversample clock pulse.

The respective outputs of the ROM sections (or separate ROMs) are delivered to an adder, which is external to the ROM. An analog output is formed by passing the output of the adder through a digital-to-analog converter.

The data stored in each stage of the register determines which set of pulse response values is selected. The oversample clock selects the individual values in the set in sequence. The values delivered by each ROM section are added together externally, thereby substantially reducing the number of bit locations required in the ROM.

The embodiments according to this invention are particularly useful with data systems having three or more symbol states. For example, in the filter described above as requiring over 17,000 square mils of ROM, the combined area of the ROM and adder in an embodiment according to this invention would occupy only 700 square mils.

DESCRIPTION OF THE INVENTION

Figure 7:
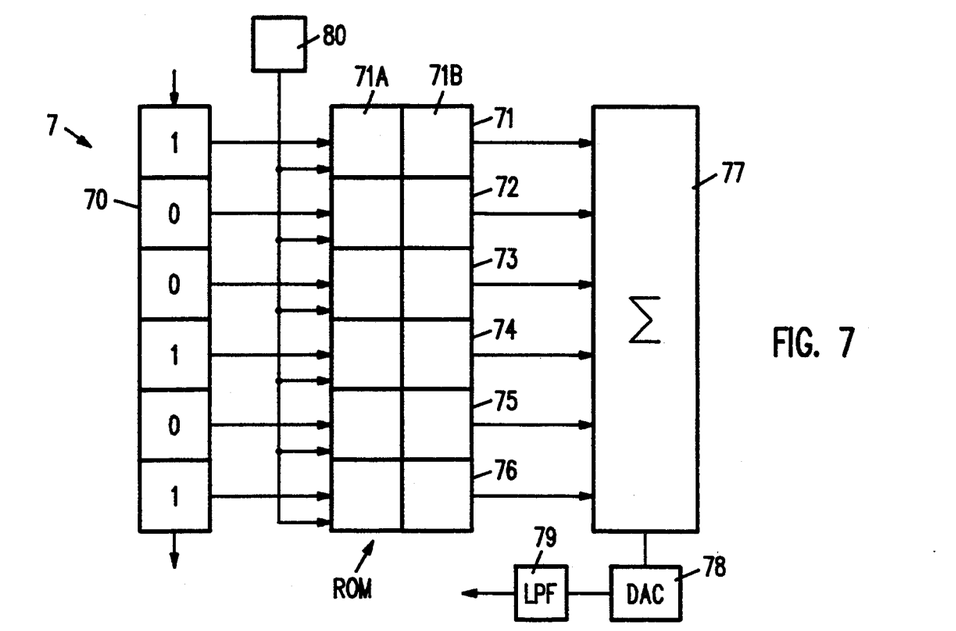
FIG. 7 illustrates a block diagram of a simple ROM filter in accordance with this invention.

FIG. 7 illustrates a first embodiment in accordance with this invention. ROM filter 7 includes a shift register 70, the respective stages of which are connected to one of ROMs 71, 72, 73, 74, 75 and 76. An output of each of ROMs 71-76 is connected to an adder 77, the output of which is passed through a DAC 78 and a low-pass filter 79. ROMs 71-76 are clocked by an oversample clock pulse generator 80.

Figure 8:
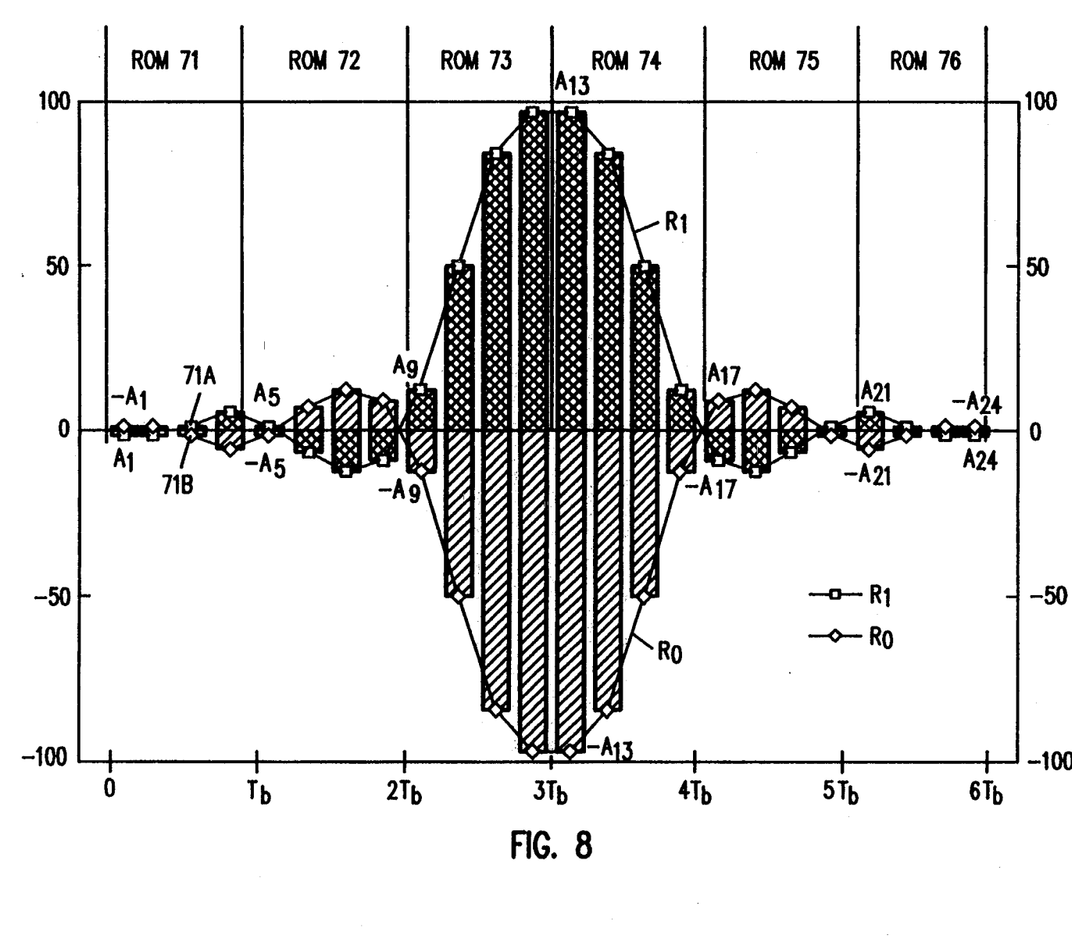
FIG. 8 illustrates the allocation of the data stored in the individual ROMs of the ROM filter.

Each of ROMs 71-76 includes two sections, illustrated by sections 71A and 71B in relation to ROM 71. The data programmed in ROMs 71-76 are further illustrated by reference to FIG. 8, in which the pulse response curves $R_1$ and $R_0$ illustrated in FIG. 5 are duplicated. In this instance, however, designated sections of curves $R_1$ and $R_0$ are allocated to individual ROMs 71-76. For example, referring to ROM 71, subsection 71A contains four values corresponding to curve $R_0$, and section 71B contains four values corresponding to curve $R_0$. The same is true of ROMs 72-76. Each of them is programmed with eight values, four of which correspond to values on curve $R_1$ and four of which correspond to values on curve $R_0$.

The data bits in the respective stages of shift register 70 determine which section of each of ROMs 71-76 is selected. Thus, the presence of a binary "1" in the stage associated with ROM 71 designates the values stored in section 71A, which correspond to curve $R_1$. Similarly, the binary "0" stored in the next stage of register 70 designates values corresponding to curve $R_0$ in ROM 72; the binary "0" stored in the next stage of shift register 70 designates values corresponding to curve $R_0$ stored in ROM 73; and so forth.

Oversample clock generator 80 generates clock pulses at a rate equal to four times the rate at which data bits are shifted into register 70. Thus, each time a new bit is shifted into register 70, appropriate sections of ROMs 71-76 are selected, and four values representative of curve $R_1$ or curve $R_0$ are delivered in sequence from ROMs 71-76 to adder 77. When these values are summed in adder 77, the result is a digital representation of the pulse response attributable to the bits stored in register 70 at a given instant in time. This digital output is delivered to DAC 78 where it is converted into analog form and passed through low-pass filter 79 for smoothing.

The total number of bits required in ROMs 71-76 can be represented by the following expression:

$$S \times n \times \Delta \times D$$

where S, n, $\Delta$ and D are defined as above. For an 8-bit DAC, ROMs 71-76 require only 384 bits.

Figure 9A:
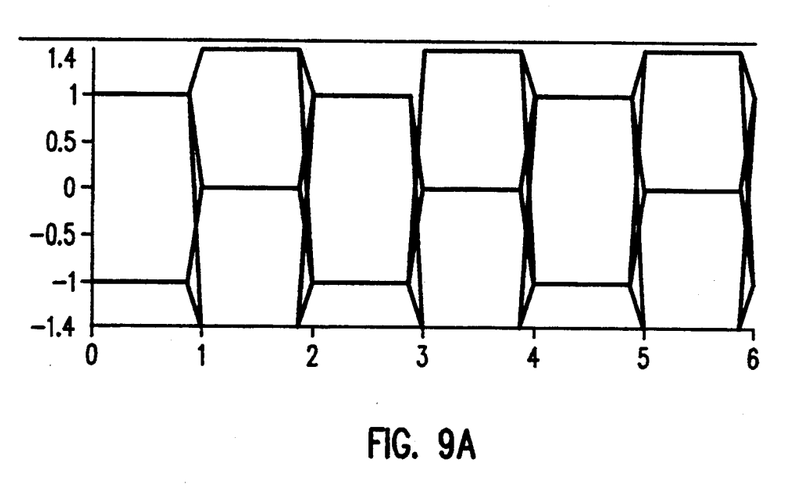
FIGS. 9A and 9B illustrate the actual and filtered data bits, respectively, in a $\pi/4$-DQPSK coding system.
Figure 9B:
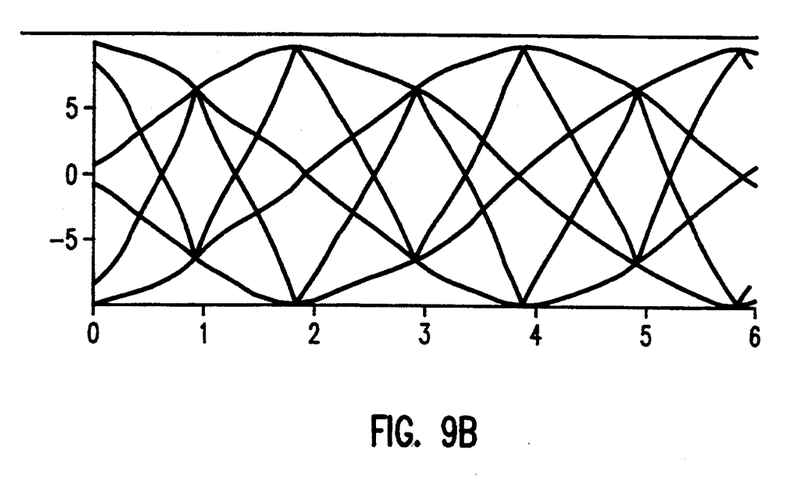

As noted above, this invention is particularly useful in data systems which have more than two symbol states, since the required number of memory cells increases rapidly with the number of symbol states. This aspect of the invention will be illustrated with reference to a second embodiment, which uses the $\pi/4$-DQPSK system of coding. Under the $\pi/4$-DQPSK system, there are five symbol states separated into a group of two symbol states and a group of three symbol states. Data in one of the two symbol states can be followed only by data in one of the three symbol states, and data in one of the three symbol states can be followed only by data in one of the two symbol states. This is illustrated in FIG. 9A, where the two symbol states are represented by 1 V and $-1$ V, and the three symbol states are represented by 1.4 V, 0 V and $-1.4$ V. The $\pi/4$-DQPSK system is described more fully in an article by Y. Akaiwa, entitled "Digital Modulation/Demodulation Techniques for Mobile Radio Communications in Japan", IEICE transactions, vol. E 74, No. 6, June, 1991, pp. 1503-1511, which is incorporated herein by reference.

Figure 10:
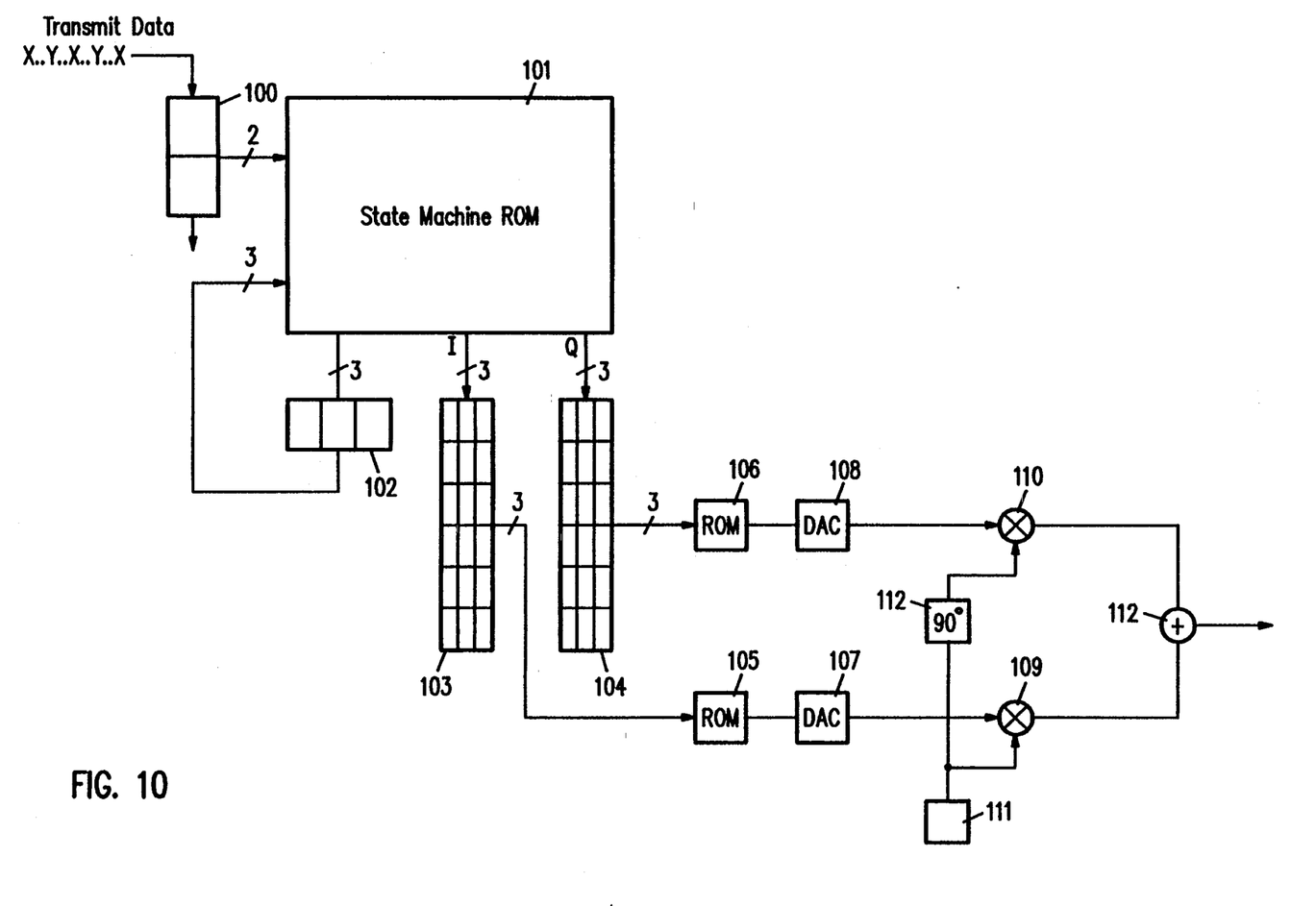
FIG. 10 illustrates a block diagram of a second embodiment of the invention.

A block diagram of this embodiment is illustrated in FIG. 10. The actual transmit data are read into a register 100. From register 100, the data enter a state machine ROM 101, which has associated with it a state register 102. State machine ROM 101 is a mask-programmable state machine which codes the data bits into 3-bit binary words. (Three-bit words are required in this embodiment since the transmit data may be in any one of five symbol states.) Since this embodiment includes a quadrature modulation system, state machine ROM 101 has both I and Q outputs, which deliver symbols representing the transmit data to a dual mixer-modulator having local oscillators with a phase separation of 90°.

The I and Q outputs of state machine ROM 101 are connected to an I symbol register 103 and a Q symbol register 104, respectively. As indicated registers 103 and 104 are 6-stage registers, each stage of which is capable of holding a 3-bit word. The 3-bit words held in registers 103 and 104 are representative of one of the five symbol states in the $\pi/4$-DQPSK system. The data in these registers are entered into ROM filters 105 and 106 and are converted into analog outputs in DACs 107 and 108. As in a conventional quadrature modulation system, the outputs of DACs 107 and 108 are fed to mixers 109 and 110, respectively, which receive a signal from an oscillator 111. The phase of the signal from oscillator 111 is shifted by 90° in a phase shifter 112 before it is delivered to mixer 110. The outputs of mixers 109 and 110 are summed in an adder 112, which delivers the modulated signal.

Figure 11:
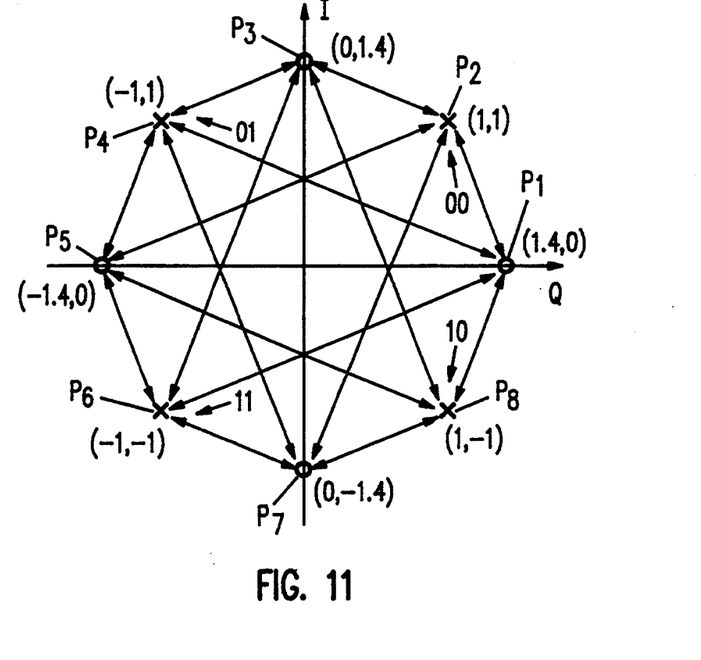
FIG. 11 illustrates the constellation for the $\pi/4$-DQPSK coding system.

The operation of state machine ROM 101 and registers 103 and 104 can best be understood by reference to FIG. 11, which illustrates the signal phase points and trajectory of the $\pi/4$-DQPSK system. The vertical axis of the figure represents the symbol at the I output, and the horizontal axis represents the symbol at the Q output. The points $p_1$–$p_8$ around the periphery of the figure represent all possible combinations of the symbols at the I and Q outputs. The arrows represent permissible transitions between points $p_1$–$p_8$. In each instance, there are four permissible transitions from each point. For example, from point $p_1$ (I=0 V, Q=1.4 V), the transition may be to point $p_2$ (I=1 V, Q=1 V), point $p_4$ (I=1 V, Q=$-1$ V), point $p_6$ (I=$-1$ V, Q=$-1$ V), or point $p_8$ ($I = -1$ V, $Q = 1$ V). If the transition is to point $p_4$, for example, the next transition must be to point $p_1$, $p_3$, $p_5$ or $p_7$. In general, the transitions go from a point on one of the axes to a point which is not on one of the axes, and vice-versa.

Referring again to FIG. 10, state register 102 and each of the stages of registers 103 and 104 hold a 3-bit word which represents one of the five possible symbol states. For example, the coding could be as follows:

| | |
|---|---|
| 1.4 V: | 010 |
| 1 V: | 001 |
| 0 V: | 000 |
| −1 V: | 101 |
| −1.4 V: | 110 |

Neither the coding or the number of symbols is critical to the invention. Rather, the invention is applicable to any number of symbols and any coding system.

State register 102 holds a 3-bit word which designates one of points $p_1$–$p_8$ in FIG. 11. For example, the coding of points $p_1$–$p_8$ could be arranged as follows:

| | |
|---|---|
| $p_1$: | 000 |
| $p_2$: | 001 |
| $p_3$: | 010 |
| $p_4$: | 011 |
| $p_5$: | 100 |
| $p_6$: | 101 |
| $p_7$: | 110 |
| $p_8$: | 111 |

The transmit data are shifted into register 100 at a clock rate equal to $f_b$ and are entered into state machine ROM 101 in pairs at a clock rate equal to $f_b/2$, known as the symbol rate. Thus, register 100 is essentially a serial-to-parallel converter, with pairs of bits being fed in parallel to state machine ROM 101. For this reason, the transmit data are shown as XY pairs in FIG. 10.

Acting in conjunction with the word stored in state register 102, the bit pairs delivered from register 100 define one of the transitions illustrated in FIG. 11. For example, assume that a word 000 designating point $p_1$ is stored in state register 102. As shown in FIG. 11, the transition to point $p_2$ could be defined by 00, the transition to point $p_4$ could be defined by 01, the transition to point $p_6$ could be defined by 11, and the transition to point $p_8$ could be defined by 10. With this system, if the XY pair in register 100 was a 01, for example, a transition to point $p_4$ would be defined. State machine ROM 101 is programmed such that binary representations of the symbols 1 V and −1 V would then be delivered at its I and Q outputs, respectively, and state register 102 would be updated to a value representing $p_4$.

State machine ROM 101 is a 32-bit by 9-bit ROM in this embodiment. The combined 5-bit input from registers 100 and 102 constitutes a row address which is decoded in state machine ROM 101. The data stored in each of the columns at the designated row are read from state machine ROM 101. Three bits are delivered to the I output and designate the symbol to be shifted into register 103, three bits are delivered at the Q output and designate the symbol to be shifted into register 104; three bits represent one of the combined I/Q data points shown in FIG. 11 and are delivered to state register 102. Thus, state register 102 at all times holds data representing the current state, while register 100 contains data which define the transition to the next state.

Figure 12:
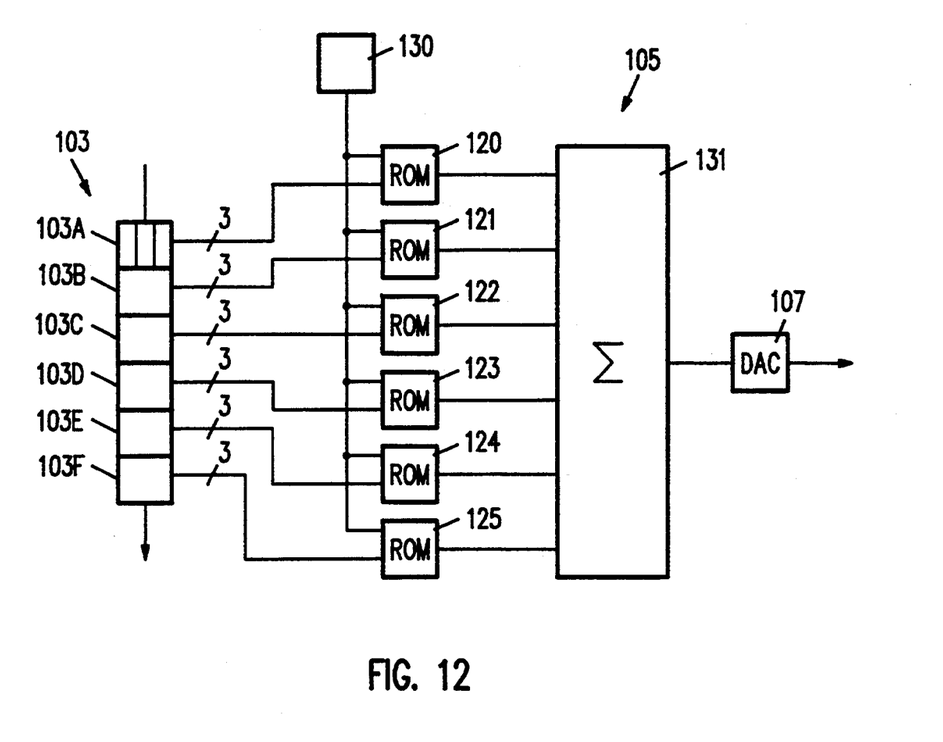
FIG. 12 illustrates a block diagram of the ROMs and associated elements in the second embodiment.

FIG. 12 illustrates the structure of I symbol register 103 and ROM filter 105. (Q symbol register 104 and ROM filter 106 have similar structures and will not be described separately.) As described above, I symbol register 103 holds six 3-bit words each of which is representative of a symbol. Each of stages 103A to 103F is connected to a respective one of ROMs 120 to 125. Each of ROMS 120 to 125 is divided into five sections, each section containing data describing points on one of the five possible pulse response curves shown in FIG. 13.

Figure 13:
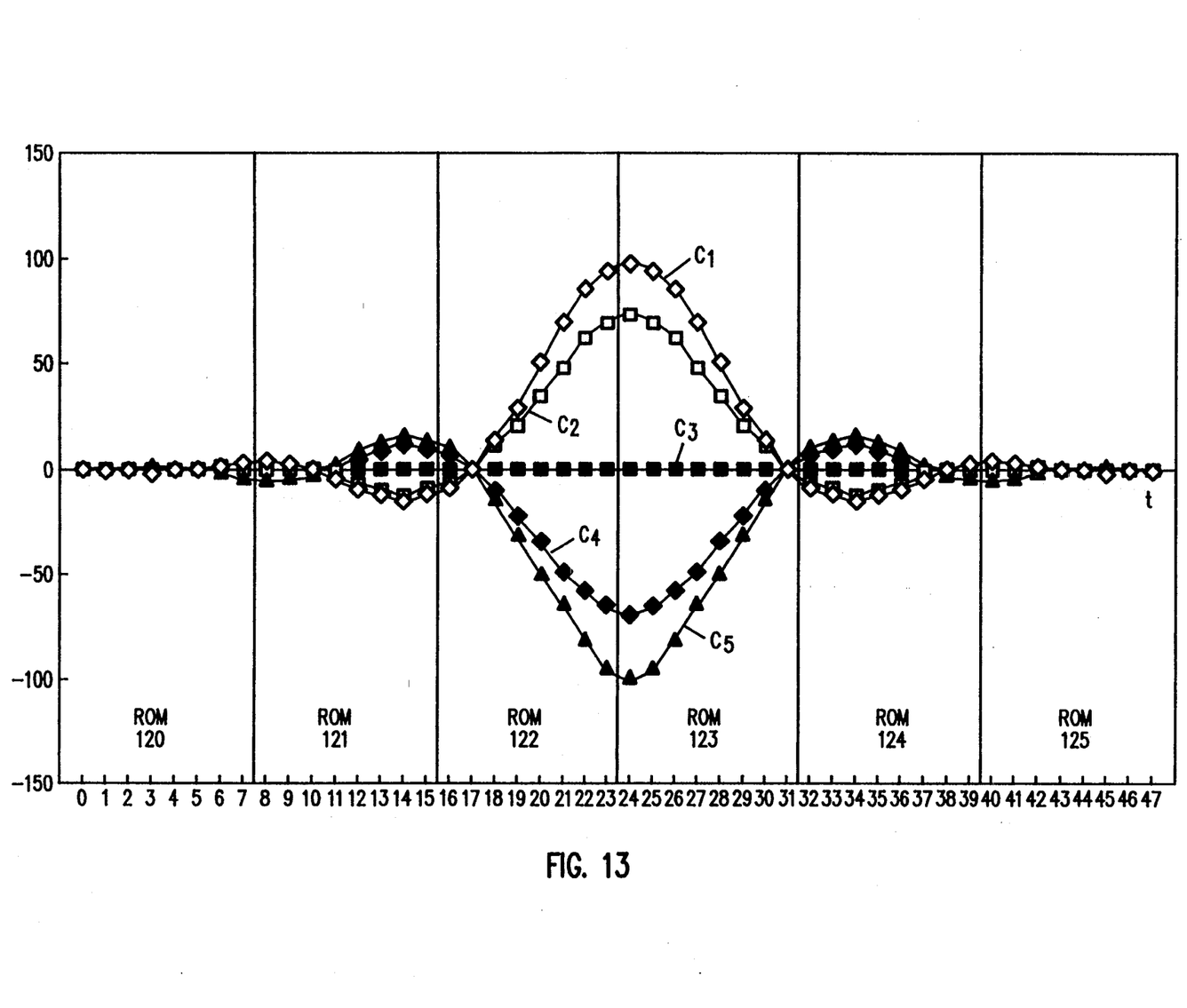
FIG. 13 illustrates the five pulse response curves for the $\pi/4$-DQPSK coding system, indicating of the data defining the curves is apportioned to the individual ROMs.

FIG. 13 illustrates pulse response curves $C_1$, $C_2$, $C_3$, $C_4$ and $C_5$, which show the pulse response of the 1.4 V, 1.0 V, 0 V, −1.0 V and −1.4 V levels in the $\pi/4$-DQPSK system. The data in each ROM pertain to a given time interval, determined by the oversample rate, as also illustrated in FIG. 13. For example, ROM 120 contains data for each of curves $C_1$–$C_5$ for the first time interval, ROM 121 contains data for the same curves for the second time interval, etc. Each of ROMs 120 to 125 is clocked by an oversample clock 130, which in this embodiment operates at a clock rate $f_{ov}$ equal to eight times the symbol rate, or four times the data bit rate $f_b$.

The respective outputs of ROMs 120 to 125 are delivered to an adder 131 whose output is passed to DAC 107. The output of DAC 107 is an analog signal which represents the transmit data after filtering.

As the symbols are fed into register 103, the output of each of stages 103A to 103F represents an address of one of the five possible response curves shown in FIG. 13 during a particular time interval. Each output identifies a section of one of ROMs 120 to 125, which contains eight values defining a pulse response curve during the particular time segment.

Oversample clock 130 causes ROMs 120 to 125 to deliver these eight values in sequence to adder 131, where after each oversample clock pulse they are added and delivered to DAC 107. This process continues until all of the eight values, defining the curve during the time interval, have been delivered to adder 131. Then a new symbol is shifted into I symbol register 103, and the process is repeated. In this way, the output of DAC 107 delivers a signal representative of the filtered transmit data.

ROMS 120 to 125, Which may be sections of a single ROM, are required to hold only data representing the five possible pulse response curves $C_1$–$C_5$ during a particular time interval. The addition of the data takes place external to the ROM, and thus the ROM need not hold data, in a particular area of memory, for all possible combinations of the input signals. Instead, the combination of the data takes place in adder 131.

This substantially reduces the number of memory cells that are required in the ROM. For a system having five symbol states, a 6-symbol pulse response, eight clock pulses per symbol, and an 8-bit DAC, only 1,920 bits are required, as compared with 1,000,000 bits in a conventional ROM filter. Even allowing for the area occupied by the adder, this ROM filter would take up only about 850 square mils.

Thus, a ROM filter in accordance with this invention allows the die size to be markedly reduced without impairing the functional characteristics of the filter.

Figure 14:
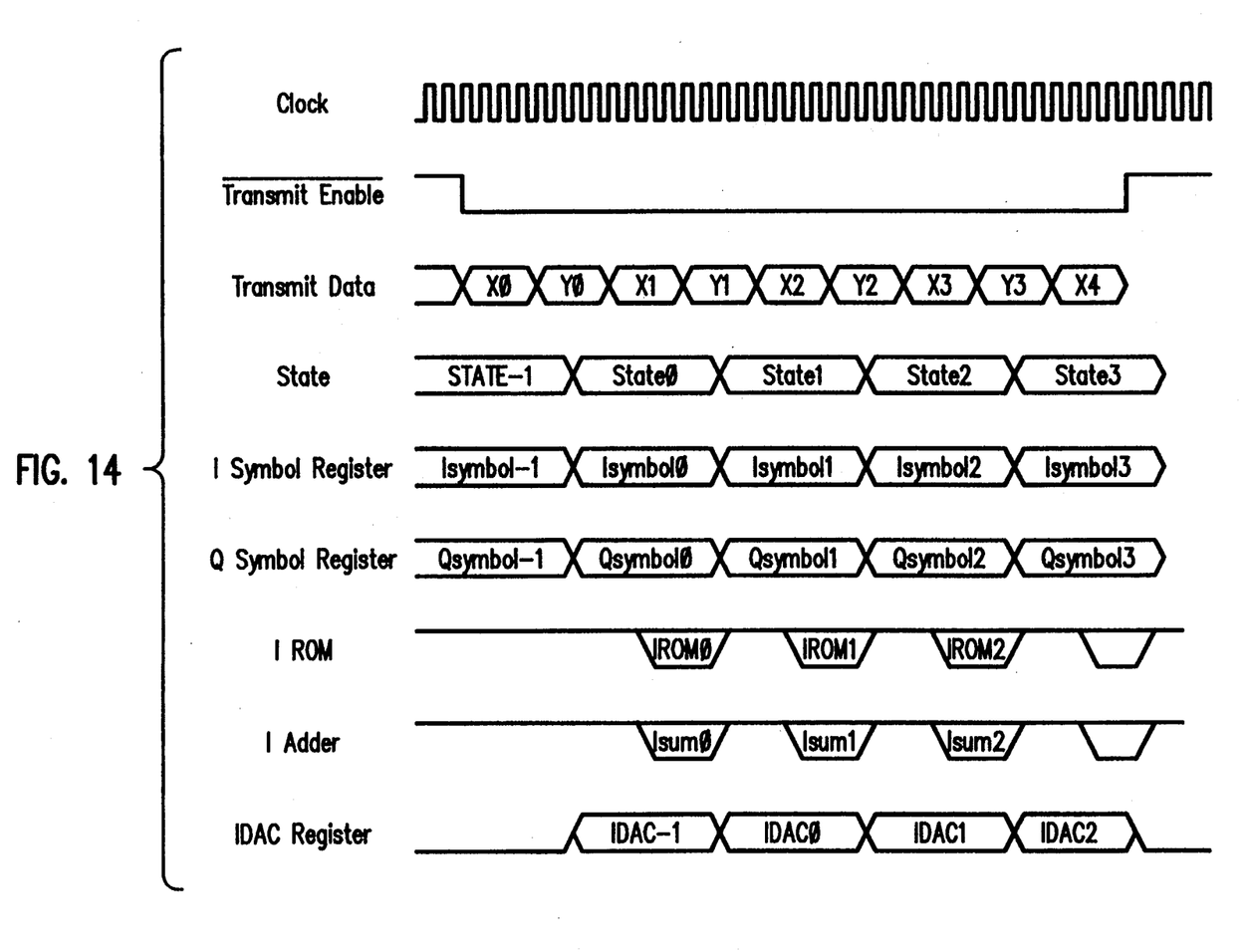
FIG. 14 illustrates a timing diagram of the state machine ROM and the ROM filter in the second embodiment.

FIG. 14 illustrates a timing diagram for the system illustrated in FIG. 10. As indicated, state machine 101 is enabled shortly after the second (Y) bit of a bit pair is shifted into register 101. I and Q outputs are delivered from state machine ROM 101 during the same period.

ROMs 120-125 and adder 131 (FIG. 12) are enabled during the second half of the same period. DAC 107 is enabled synchronously with state machine ROM 101. The clock pulses shown in the top curve of FIG. 14 represent clock pulses delivered by clock generator 130. As indicated, eight clock pulses occur during a single cycle of state machine ROM 101.

While this invention has been illustrated with reference to particular embodiments, it will be apparent to those skilled in the art that numerous alternative embodiments may also be constructed in accordance with the broad principles of this invention. It is intended that principles of this invention extend to all such alternative embodiments.

We claim:

1. A ROM filter comprising:
   a register having a plurality of register stages, each of said stages capable of being placed into any one of a plurality of states;
   a plurality of ROMs, an input of each of said ROMs being connected to an output of one of said register stages, each of said ROMs comprising a plurality of sections, the number of said sections in each of said ROMs being equal to the number of said states of the register stage to which said ROM is connected, each of said sections being programmed to hold data which represent a portion of a pulse response curve;
   an oversample clock pulse generator connected to each of said ROMs; and
   an adder, an output of each of said ROMs being connected to an input of said adder;
   wherein said oversample clock pulse generator is adapted to deliver a sequence of oversample clock pulses to each of said ROMs so as to cause the data held in a particular section within each of said ROMs to be delivered in sequence to said adder.

2. The ROM filter of claim 1 wherein the state of each of said register stages determines the particular section within the ROM connected to said register stage from which said data will be delivered to said adder, without regard to the state of any other of said register stages.

3. The ROM filter of claim 2 wherein each of said ROMs transmits a digital value representing one of said data to said adder in response to a clock pulse from said oversample clock pulse generator.

4. The ROM filter of claim 1 wherein said register is binary and each of said ROMs comprises two of said sections.

5. The ROM filter of claim 1 wherein each stage of said register is capable of being placed in at least three of said states and each of said ROMs comprises at least three of said sections.

6. The ROM filter of claim 5 wherein each stage of said register is adapted to hold a binary word representative of one of a plurality of symbols, each of said symbols corresponding to a pulse response curve.

7. The ROM filter of claim 6 further comprising a means of translating a series of binary pulses into a sequence of binary words representative of symbols and a means of shifting said binary words into said register.

8. The ROM filter of claim 7 wherein said means of translating comprises a state machine ROM.

9. The ROM filter of claim 8 wherein said state machine ROM has an I output and a Q output, one of said outputs being connected to said register.

10. The ROM filter of claim 8 further comprising a state register, an input and an output of said state register being connected to said state machine ROM.

11. The ROM filter of claim 10 further comprising a transmit data register, an output of said transmit data register being connected to said state machine ROM.

12. The ROM filter of claim 11 wherein said state register holds data representing one of said symbols and said transmit data register holds data representing a transition to another of said symbols.

13. The ROM filter of claim 1 wherein said portion of said pulse response curve relates to a selected time interval.

14. The ROM filter of claim 1 further comprising a digital-to-analog converter connected to the output of said adder.

15. The ROM filter of claim 14 further comprising a low-pass filter connected to the output of said digital-to-analog converter.

16. The ROM filter of claim 1 wherein said ROMs are included within a single larger ROM.

17. A method of filtering a signal which includes a sequence of digital values, said method comprising:
   selecting a digital system containing a selected number of symbols;
   identifying a plurality of pulse response curves each of said pulse response curves corresponding to one of said symbols;
   dividing each of said pulse response curves into a predetermined number of time intervals;
   identifying a selected number of data points on each of said pulse response curves during each of said time intervals;
   providing a plurality of ROMs each ROM having a number of sections equal to the number of said symbols;
   programming each section of each ROM with values representing the data points on one of said pulse response curves during a particular time interval;
   providing a register having a plurality of stages, an output of each stage being connected to one of said ROMs;
   entering said signal into said register at a predetermined clock rate;
   clocking each of said ROMs at an overclock rate, said overclock rate being equal to said clock rate multiplied by the number of values stored in each section of each ROM;
   summing respective outputs of said ROMs to obtain a digital output signal; and
   converting said digital output signal to an analog output signal.

18. The method of claim 17 wherein the digital value in each stage of said register determines a section in the ROM connected to said stage, the values in the section so determined being used in said summing step.

19. Apparatus for translating a series of binary bits into a digital system including a plurality of symbols, said digital system comprising first and second groups of said symbols, a symbol in said first group being followed by a symbol in said second group, said apparatus comprising a state machine ROM, a state register and an input register, said state machine ROM being connected to an output of said input register and to an input and an output of said state register, said state register being adapted to hold data representing a symbol in one of said first and second groups and said input register being adapted to hold data representing a transition from said symbol in said one of said first and second groups to a symbol in the other of said first and second groups.

* * * * *